United States Patent
Yokozutsumi et al.

(10) Patent No.: US 9,806,691 B2
(45) Date of Patent: Oct. 31, 2017

(54) FILTER DEVICE AND ELECTRIC-VEHICLE DRIVE CONTROLLER

(71) Applicants: Ryo Yokozutsumi, Tokyo (JP); Akihiro Murahashi, Tokyo (JP); Takushi Jimichi, Tokyo (JP); Tsuguhiro Takuno, Tokyo (JP); Yudai Yoneoka, Tokyo (JP)

(72) Inventors: Ryo Yokozutsumi, Tokyo (JP); Akihiro Murahashi, Tokyo (JP); Takushi Jimichi, Tokyo (JP); Tsuguhiro Takuno, Tokyo (JP); Yudai Yoneoka, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/760,619

(22) PCT Filed: Feb. 6, 2013

(86) PCT No.: PCT/JP2013/052741
§ 371 (c)(1),
(2) Date: Jul. 13, 2015

(87) PCT Pub. No.: WO2014/122736
PCT Pub. Date: Aug. 14, 2014

(65) Prior Publication Data
US 2015/0357988 A1    Dec. 10, 2015

(51) Int. Cl.
*H02P 27/06*    (2006.01)
*H03H 7/01*    (2006.01)
(Continued)

(52) U.S. Cl.
CPC .......... *H03H 7/1741* (2013.01); *B60L 3/003* (2013.01); *B60L 3/04* (2013.01); *B60L 9/005* (2013.01);
(Continued)

(58) Field of Classification Search
CPC ......... H03H 7/1741; H03H 7/09; H02P 27/06
See application file for complete search history.

(56) References Cited

U.S. PATENT DOCUMENTS 4,086,983 A * 5/1978 Anzai ............... H02P 7/281
                                              187/297
4,858,054 A * 8/1989 Franklin ........... H02H 3/023
                                              361/105
(Continued)

FOREIGN PATENT DOCUMENTS

EP    1 198 876 B1    5/2004
EP    1 610 450 A2    12/2005
(Continued)

OTHER PUBLICATIONS

SiCInverter14760619; IEEE, Jul. 2011. vol. 58, SiC versus Si-Evaluation of Potentials for Performance Improvement of Inverter and DC-DC Converter Systems by SiC Power Semiconductors Juergen Biela, Member, IEEE, Mario Schweizer, Student Member, IEEE, Stefan Waffler, Student Member, IEEE,and Johann W. Kolar, Senior Member, IEEE.*

(Continued)

*Primary Examiner* — Shawki S Ismail
*Assistant Examiner* — Muhammad S Islam
(74) *Attorney, Agent, or Firm* — Buchanan Ingersoll & Rooney PC

(57) ABSTRACT

A filter device that removes a noise current generated by an inverter includes a first filter capacitor that is provided in parallel to a direct-current unit of the inverter, a first filter (Continued)

reactor that is provided between a high-potential side of the first filter capacitor and an overhead line that is a power supply source of direct-current power, and a series circuit unit in which a fuse serving as a circuit disconnecting unit that is disconnected when a current larger than a rated current flows therein, a second filter reactor serving as an inductance element, and a second filter capacitor serving as a capacitance element are connected in series, where one end of the series circuit unit is connected to a low-potential side of the first filter capacitor and one end of the first filter reactor is connected to the series circuit unit.

20 Claims, 11 Drawing Sheets

(51) Int. Cl.
  B60L 3/00   (2006.01)
  B60L 3/04   (2006.01)
  B60L 9/22   (2006.01)
  B60L 11/18  (2006.01)
  H03H 7/09   (2006.01)
  B60L 9/00   (2006.01)
  B60L 9/18   (2006.01)

(52) U.S. Cl.
  CPC ............... B60L 9/18 (2013.01); B60L 9/22 (2013.01); B60L 11/1864 (2013.01); H02P 27/06 (2013.01); H03H 7/09 (2013.01); H03H 7/1758 (2013.01); B60L 2200/26 (2013.01); B60L 2270/147 (2013.01); Y02T 10/7005 (2013.01); Y02T 10/7061 (2013.01)

(56) References Cited

U.S. PATENT DOCUMENTS

| | | | |
|---|---|---|---|
| 5,021,725 A | | 6/1991 | Jimbo et al. |
| 5,576,580 A | | 11/1996 | Hosoda et al. |
| 5,731,965 A | * | 3/1998 | Cheng ............... H02J 3/01 307/105 |
| 6,140,866 A | * | 10/2000 | Wang ............... H02J 3/01 327/552 |
| 7,417,842 B2 | | 8/2008 | Miyazaki et al. |
| 2002/0149417 A1 | * | 10/2002 | Kumano ............... B60L 9/005 327/552 |
| 2014/0225547 A1 | | 8/2014 | Yokozutsumi et al. |

FOREIGN PATENT DOCUMENTS

| | | |
|---|---|---|
| EP | 2 302 774 A2 | 3/2011 |
| GB | 2399465 A | 9/2004 |
| JP | 53-29531 A | 3/1978 |
| JP | 1-291602 A | 11/1989 |
| JP | 2-81737 A | 3/1990 |
| JP | 2-151202 A | 6/1990 |
| JP | 6-253405 A | 9/1994 |
| JP | 6-311730 A | 11/1994 |
| JP | 7-186788 A | 7/1995 |
| JP | 9-140051 A | 5/1997 |
| JP | 9-149549 A | 6/1997 |
| JP | 10-42461 A | 2/1998 |
| JP | 63-121401 A | 5/1998 |
| JP | 2000-152643 A | 5/2000 |
| JP | 2002-315101 A | 10/2002 |
| JP | 2003-32882 A | 1/2003 |
| JP | 2003-533754 A | 11/2003 |
| JP | 2004-236059 A | 8/2004 |
| JP | 2004-336845 A | 11/2004 |
| JP | 2005-117218 A | 4/2005 |
| JP | 2005-176528 A | 6/2005 |
| JP | 2006-6002 A | 1/2006 |
| JP | 2006-238626 A | 9/2006 |
| JP | 2006-320023 A | 11/2006 |
| JP | 2007-318993 A | 12/2007 |
| JP | 2008-168795 A | 7/2008 |
| JP | 2010-252443 A | 11/2010 |
| JP | 2011-78161 A | 4/2011 |
| JP | 5031128 B1 | 7/2012 |
| WO | WO 2011/086822 A1 | 7/2011 |

OTHER PUBLICATIONS

SiCInverter14760619; IEEE, Jul. 2011. vol. 58, SiC versus Si-Evaluation of Potentials for Performance Improvement of Inverter and DC-DC Converter Systems by SiC Power Semiconductors Juergen Biela, Member, IEEE, Mario Schweizer, Student Member, IEEE, Stefan Waffler, Student Member, IEEE,and Johann W. Kolar, Senior Member, IEEE; pp. 2872-2882.*

International Search Report (PCT/ISA/210) mailed on May 14, 2013, by the Japanese Patent Office as the International Searching Authority for International Application No. PCT/JP2013/052741.

Written Opinion (PCT/ISA/237) mailed on May 14, 2013, by the Japanese Patent Office as the International Searching Authority for International Application No. PCT/JP2013/052741.

English translation of the Office Action for the Notice of Rejection mailed Aug. 5, 2014, for Japanese Application No. 2014-525210.

English translation of the Office Action for the Decision of Rejection mailed Jan. 6, 2015, for Japanese Application No. 2014-525210.

Japanese Office Action dated Nov. 17, 2015 issued in corresponding Japanese Patent Appln. No. 2015-048433, with English translation (7 pages).

Office Action issued by the European Patent Office on Feb. 7, 2017 in corresponding European Application No. 13874497.4 (5 pages).

Office Action issued by the State of Intellectual Property Office of the People's Republic of China on Dec. 26, 2016 in corresponding Chinese Application No. 2013800722374 (16 pages) Partial Translation.

* cited by examiner

FILTER DEVICE AND ELECTRIC-VEHICLE DRIVE CONTROLLER

FIELD

The present invention relates to a filter device and an electric-vehicle drive controller.

BACKGROUND

As a conventional electric-vehicle drive controller, for example, Patent Literature 1 listed below discloses an apparatus that includes a filter device constituted by a filter reactor and a filter capacitor on an input side (a direct-current overhead-line side) of an inverter, thereby preventing a noise current generated when the inverter drives a motor from flowing out to the direct-current overhead-line side.

Meanwhile, when a noise current generated by an inverter is large or when a noise-current regulation value is small (that is, when the withstanding amount of the noise current is small), for example, there is a case of configuring a double-stage filter to further reliably prevent the noise current from flowing out, as described in Patent Literature 2 listed below.

The filter device disclosed in Patent Literature 2 is configured by using a filter reactor in which filters of a double-stage filter are magnetically coupled to each other for improving a noise-current suppression effect (a flowing-out prevention effect), as compared to the filter device described in Patent Literature 1. Further, in the filter device disclosed in Patent Literature 2, a third filter reactor is electrically connected to an intermediate tap drawn from a connection point of a first filter reactor constituting a first-stage filter and a second filter reactor constituting a second-stage filter. The third filter reactor is used for canceling a negative equivalent inductance generated by magnetic coupling of the first and second filter reactors. By providing the third filter reactor, it is made possible to obtain an originally intended double-stage filter. Accordingly, the noise-current attenuation characteristic in a high-frequency region that is degraded if the third filter reactor is not provided can be the noise-current attenuation characteristic originally intended for a double-stage filter. By using filter reactors that are magnetically coupled to each other, downsizing thereof can be achieved.

CITATION LIST

Patent Literatures

Patent Literature 1: Japanese Patent Application Laid-open No. H02-151202
Patent Literature 2: Japanese Patent Application Laid-open No. 2002-315101

SUMMARY

Technical Problem

However, in the filter device described in Patent Literature 2 listed above, when a short-circuit fault has occurred in a second filter capacitor connected to an intermediate tap, a short-circuit current from an overhead line does not flow to a first filter reactor, but only flows through a second filter reactor. Accordingly, a fault current flowing through the second filter capacitor having the short-circuit fault occurred therein becomes large, and a circuit breaker of a system on a higher level than a circuit breaker provided between the overhead line and the filter device may be operated. When the circuit breaker of a higher-level system is accidentally operated, power supply to other electric vehicles is also stopped, so that there has been a problem that the vehicle operation of an entire railway company is greatly hindered.

Even when the circuit breaker of a higher-level system is not operated but a circuit breaker of a vehicle itself is operated, it is difficult to determine whether a fault has occurred in a second filter capacitor or an inverter, and thus the inverter cannot be operated. Accordingly, the vehicle cannot travel to a rail yard and the like by itself and there has been a problem that the vehicle operation of the railway company is hindered to some extent.

There has been also a problem that, when a short-circuit fault occurs in the second filter capacitor, the filter characteristic is changed greatly and thus a noise-current suppression effect is degraded.

The same holds true for a case in which, when a specified-frequency bypass filter having an inductance element and a capacitance element for improving an attenuation rate of a noise current in a specified-frequency region is connected without having a substantially large inductance element between a power supply source and the specified-frequency bypass filter itself, a short-circuit fault occurs in the specified-frequency bypass filter.

The present invention has been achieved in view of the above problems, and an object of the present invention is to provide a filter device that is, even when a short-circuit fault occurs in a capacitance element that is connected without having a substantially large inductance element between a power supply source and the capacitance element itself, capable of immediately removing the short-circuit fault and operating an inverter after the short-circuit fault has been removed.

Solution to Problem

In order to solve the aforementioned problems, a filter device that removes a noise current generated by an inverter according to one aspect of the present invention is constructed to include: a filter capacitor that is provided in parallel to a direct-current unit of the inverter; a filter reactor that is provided between a high-potential side of the filter capacitor and a power supply source of direct-current power; and a series circuit unit in which a circuit disconnecting unit that is disconnected when a current larger than a rated current flows therein, an inductance element, and a capacitance element are connected in series, where one end of the series circuit unit is connected to a low-potential side of the filter capacitor and one end of the filter reactor is connected to the series circuit unit.

Advantageous Effects of Invention

According to the present invention, even when a short-circuit fault occurs in a capacitance element that is connected without having a sufficiently large inductance element between a power supply source and the capacitance element itself, it is made possible to securely remove the short-circuit fault and to operate an inverter after the short-circuit fault has been removed.

BRIEF DESCRIPTION OF DRAWINGS

FIG. 4 is a diagram illustrating a configuration of an electric-vehicle drive controller disclosed in Patent Literature 1 and the like.

DESCRIPTION OF EMBODIMENTS

Exemplary embodiments of a filter device and an electric-vehicle drive controller according to the present invention will be explained below in detail with reference to the accompanying drawings. The present invention is not limited to the embodiments.

First Embodiment

Figure 1:
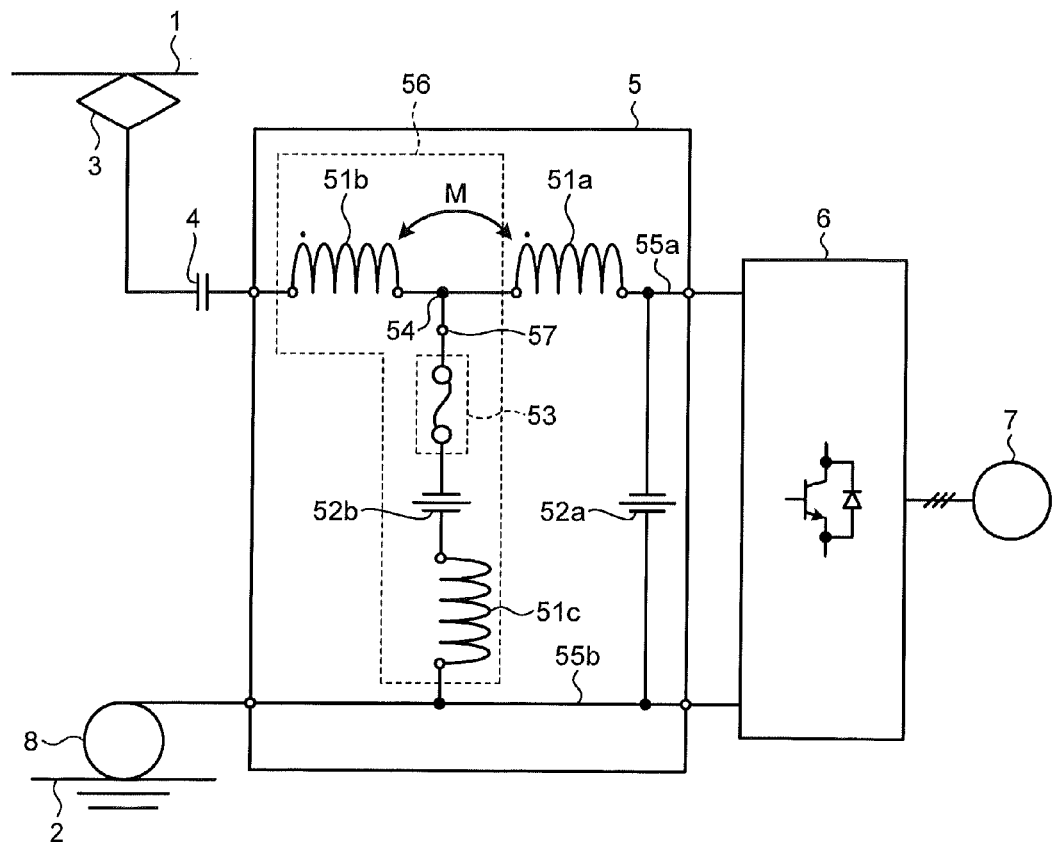
FIG. 1 is a diagram illustrating a configuration example of an electric-vehicle drive controller according to a first embodiment of the present invention.

FIG. 1 is a diagram illustrating a configuration example of an electric-vehicle drive controller according to a first embodiment of the present invention. The electric-vehicle drive controller according to the first embodiment includes, as main constituent parts, a filter device 5, an inverter 6, and a motor (an induction motor or a synchronous motor) 7. The filter device 5 is positioned between a circuit breaker 4 provided on a side of a power supply source of direct-current power and the inverter 6. The filter device 5 includes first to third filter reactors (51a to 51c), first and second filter capacitors (52a and 52b), and a fuse 53 serving as a circuit disconnecting unit. When a current larger than a rated current flows in the fuse 53, the fuse 53 is melted and thus a circuit is disconnected. As long as a circuit is disconnected when a current larger than a rated current flows, any device other than a fuse can be used as the circuit disconnecting unit.

In FIG. 1, a direct-current voltage is applied between an overhead line 1 serving as a power supply source of direct-current power and a rail 2, and when a power collector 3 contacts a high-potential side of the direct-current voltage, the direct-current voltage is applied via the circuit breaker 4 and the filter device 5 to a high-potential side bus 55a of a direct-current unit of the inverter 6. A low-potential side bus 55b of the direct-current unit of the inverter 6 is connected via a wheel 8 to the rail 2. The inverter 6 converts received direct-current power into alternating-current power that is subjected to variable voltage variable frequency control (VVVF control) or constant voltage variable frequency control (CVVF control), and supplies alternating-current power to the vehicle drive motor 7. The filter device 5 removes a noise current generated by the inverter 6 and prevents the noise current from flowing out to the overhead line 1.

The first and second filter reactors (51a and 51b) illustrated in FIG. 1 are constituted by a reactor with an intermediate tap. The reactor with an intermediate tap is divided into two inductance elements, that is, the first filter reactor 51a and the second filter reactor 51b by the position of the intermediate tap. A part of the reactor with an intermediate tap closer to a side of an inverter with respect to the intermediate tap corresponds to the first filter reactor 51a. A part of the reactor with an intermediate tap closer to a side of the power supply source with respect to the intermediate tap corresponds to the second filter reactor 51b. The first filter reactor and the second filter reactor may be formed separately. When two separate reactors are formed, it is permissible that these reactors are magnetically coupled to each other or are not magnetically coupled to each other.

The first and second filter reactors (51a and 51b) are connected to the high-potential side bus 55a of the direct-current unit of the inverter 6. Because these filter reactors are a reactor with an intermediate tap, the first filter reactor 51a is magnetically coupled to the second filter reactor 51b.

One end of the first filter capacitor 52a is connected to the high-potential side bus 55a of the direct-current unit of the inverter 6 to which one end of the first filter reactor 51a is connected, and the other end of the first filter capacitor 52a is connected to the low-potential side bus 55b of the direct-current unit of the inverter 6. That is, the first filter capacitor 52a is provided in parallel to the direct-current unit of the inverter 6. The first filter capacitor 52a and the first filter reactor 51a constitute a first-stage filter circuit (a Low Pass Filter (LPF) circuit). The first filter reactor 51a is also simply referred to as "filter reactor", and the first filter capacitor 52a is also simply referred to as "filter capacitor".

One end of the fuse 53 is connected to an intermediate tap 57 drawn from a connection point 54 of the first filter reactor 51a and the second filter reactor 51b. The other end of the fuse 53 is connected to one end of the second filter capacitor 52b. The other end of the second filter capacitor 52b is connected to one end of the third filter reactor 51c. The other end of the third filter reactor 51c is connected to the low-potential side bus 55b. That is, a series circuit unit 56 in which the second filter reactor 51b, the fuse 53, the second filter capacitor 52b, and the third filter reactor 51c are connected in series is configured to be connected between the overhead line 1 and the low-potential side bus 55b via the intermediate tap 57.

The series circuit unit 56 constituted by the second filter reactor 51b, the fuse 53, the second filter capacitor 52b, and the third filter reactor 51c configures a second-stage filter circuit (an LPF circuit). The second filter reactor 51b is an inductance element that constitutes a series circuit unit, the fuse 53 is a circuit disconnecting unit, and the second filter capacitor 52b is a capacitance element. One end of the first filter reactor 51a on the side of the power supply source of direct-current power is connected to the series circuit unit 56 at the connection point 54 of the first filter reactor 51a and the second filter reactor 51b.

In FIG. 1, the fuse 53, the second filter capacitor 52b, and the third filter reactor 51c included in the series circuit unit 56 are connected in series in this order. A block of these elements connected in series is provided to be connected between the intermediate tap 57 and the low-potential side bus 55b. The connection order of these elements can be changed. For example, it is permissible that the fuse 53, the third filter reactor 51c, and the second filter capacitor 52b are provided in this order from a high-potential side. However, it should be noted that at the time of repairing after a short-circuit fault of a second filter capacitor that is described later, a fuse has been cut and thus, the second filter capacitor has an earth potential, so that a repairing operation becomes easy. For this reason, it is preferable that the fuse is provided on the high-potential side as illustrated in FIG. 1.

Figure 2:
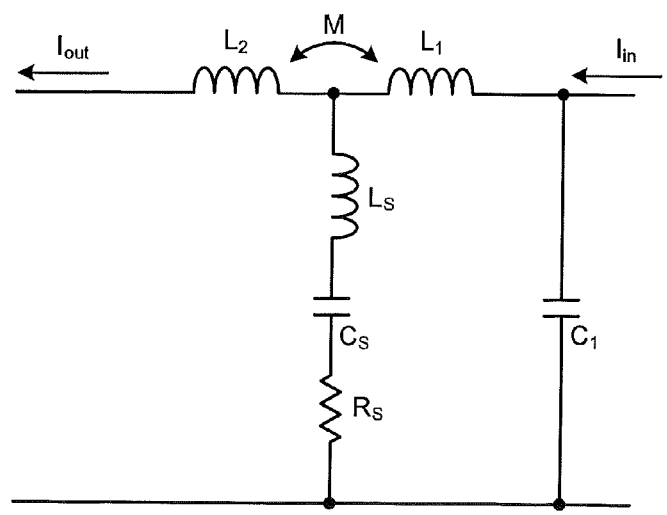
FIG. 2 is a diagram illustrating an equivalent circuit of a filter device illustrated in FIG. 1.

FIG. 2 is a diagram illustrating an equivalent circuit of the filter device 5 illustrated in FIG. 1. In FIG. 2, $L_1$ and $L_2$ denote self-inductances of the first and second filter reactors (51a and 51b), M denotes a mutual inductance between the first and second filter reactors (51a and 51b), $L_S$ denotes a self-inductance of the third filter reactor 51c, and $C_1$ and $C_S$ denote capacitances of the first and second filter capacitors (52a and 52b). $R_S$ denotes a resistance component of a circuit including the fuse 53, the second filter capacitor 52b, and the third filter reactor 51c.

Figure 3:
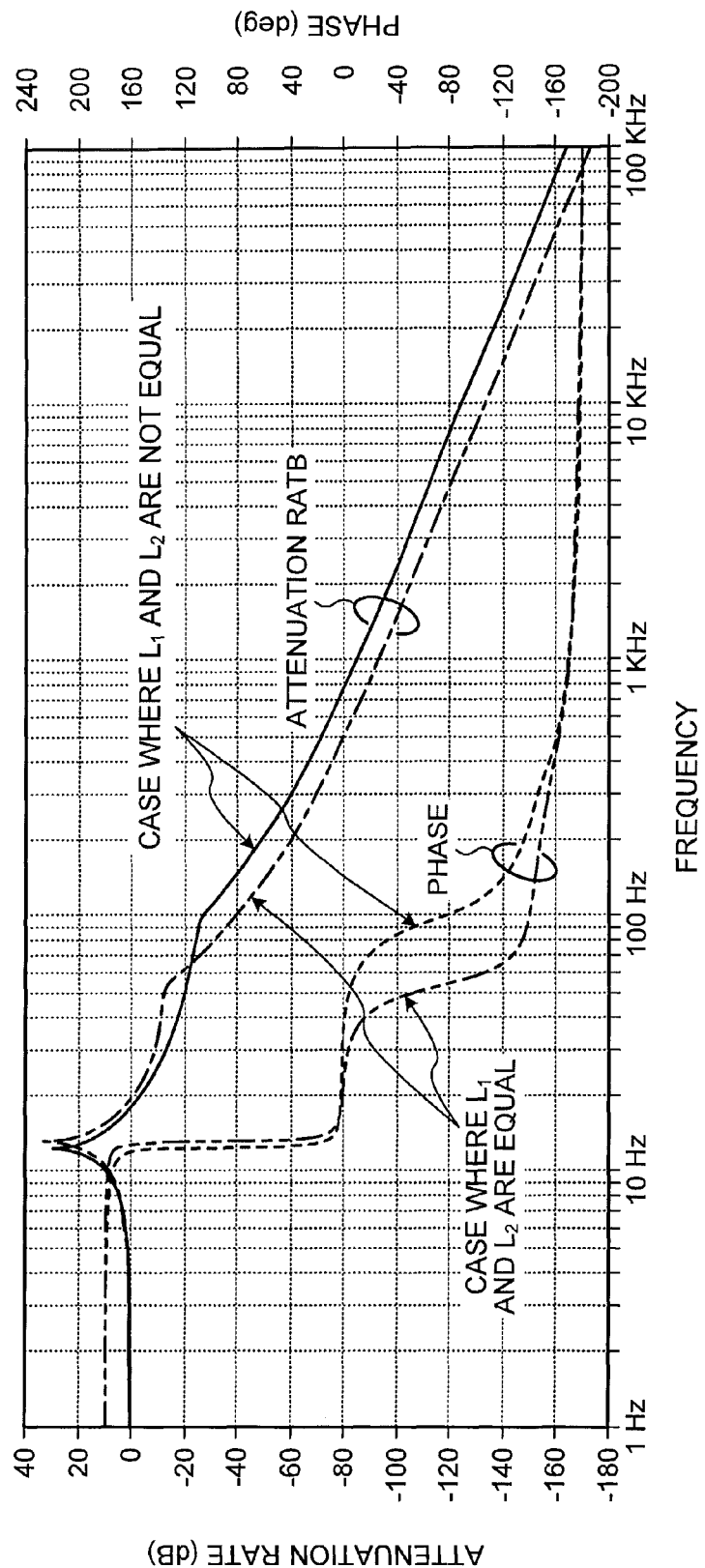
FIG. 3 is a diagram illustrating a simulation result of the equivalent circuit illustrated in FIG. 2.

Next, a simulation result of the equivalent circuit illustrated in FIG. 2 is described. FIG. 3 is a diagram (a graph) illustrating a simulation result of the equivalent circuit illustrated in FIG. 2. In FIG. 3, a solid line denotes a waveform of an attenuation rate in a case where $L_1$ and $L_2$ are not equal, a broken line denotes a waveform of a phase in the case where $L_1$ and $L_2$ are not equal, a one-dot chain line denotes a waveform of the attenuation rate in a case where $L_1$ and $L_2$ are equal, and a two-dot chain line denotes a waveform of the phase in the case where $L_1$ and $L_2$ are equal. In the following descriptions, it is assumed that a value of the resistance component $R_S$ of a series circuit unit is ignored because this value is very small. Further, it is assumed that a negative inductance component (−M) generated by a current flowing in the intermediate tap 57 due to magnetic coupling of the first and second filter reactors (51a and 51b) is canceled by an inductance component (M) of the third filter reactor 51c, and an inductance value between the intermediate tap 57 and the low-potential side bus 55b is zero or sufficiently small. That is, the third filter reactor 51c is a coupling compensation inductance element that compensates a negative equivalent inductance component generated by the current flowing in the intermediate tap 57 due to the magnetic coupling of the first and second filter reactors (51a and 51b).

Assuming that a current flowing in from a side of the inverter 6 to the filter device 5 is denoted by $I_{in}$ and a current flowing out from the filter device 5 to a side of the overhead line 1 is denoted by $I_{out}$, a noise-current suppression ratio ($I_{out}/I_{in}$) that is represented by a ratio of a flow-out current $I_{out}$ and a flow-in current $I_{in}$ can be represented by the following formula. The suppression ratio is also referred to as "attenuation rate".

[Formula 1]

$$\frac{I_{out}}{I_{in}} = \frac{1}{\omega^4 L_{1M} L_{2M} C_1 C_S - \omega^2 \{LC_1 + L_{1M} C_S\} + 1} \quad (1)$$

In the above formula, $L_{1M}$ denotes an equivalent inductance of the first filter reactor 51a, $L_{2M}$ denotes an equivalent inductance of the second filter reactor 51b, and these equivalent inductances are represented by $L_{1M}=L_1+M$ and $L_{2M}=L_2+M$, respectively. L represents a sum of the equivalent inductance $L_{1M}$ of the first filter reactor 51a and the equivalent inductance $L_{2M}$ of the second filter reactor 51b. The relation of $L=L_{1M}+L_{2M}=L_1+L_2+2M$ is established among L, $L_{1M}$, and $L_{2M}$ or between $L_1$ and $L_2$.

In order to increase the attenuation rate of a noise current, the denominator of the above formula (1) needs to be increased. However, a dominant term varies depending on frequency regions where two resonance frequencies serve as a boundary. A frequency at which the denominator of the above formula (1) is zero, that is, a resonance frequency $\omega_R$ can be represented by the following formula.

[Formula 2]

$$\omega_R = \sqrt{\frac{(LC_1 + L_{1M}C_S) \pm \sqrt{(LC_1 + L_{1M}C_S)^2 - 4L_{1M}L_{2M}C_1C_S}}{2L_{1M}L_{2M}C_1C_S}} \quad (2)$$

In the above formula (2), a frequency when a minus (−) sign is selected is a resonance frequency ($\omega_{R\_Low}$) on a low-frequency side, and a frequency when a plus (+) sign is selected is a resonance frequency ($\omega_{R\_HIGH}$) on a high-frequency side. Because of the resonance frequency $\omega_{R\_LOW}$ on the low-frequency side and the resonance frequency $\omega_{R\_HIGH}$ on the high-frequency side, a term that influences the attenuation rate most varies depending on regions and a method of maximizing the attenuation rate also varies depending on regions as represented in the following Table 1.

TABLE 1

| FREQUENCY REGION | TERM INFLUENCING ATTENUATION RATE MOST | METHOD OF MAXIMIZING ATTENUATION RATE |
|---|---|---|
| REGION (1) | 0 Hz to $\omega_{R\_LOW}$ | $\omega^4 L_{1M} L_{2M} C_1 C_S$ | $L_{1M} = L_{2M}, C_1 = C_S$ |
| REGION (2) | $\omega_{R\_LOW}$ to $\omega_{R\_HIGH}$ | $-\omega^2 \{LC_1 + L_{1M}C_S\}$ | $L_{1M} \ll L_{2M}, C_1 \ll C_S$ |

TABLE 1-continued

| | FREQUENCY REGION | TERM INFLUENCING ATTENUATION RATE MOST | METHOD OF MAXIMIZING ATTENUATION RATE |
|---|---|---|---|
| REGION (3) | $\omega_{R\_HIGH}$ and higher | $\omega^4 L_{1M} L_{2M} C_1 C_S$ | $L_{1M} = L_{2M}, C_1 = C_S$ |

With reference to Table 1, in regions (1) and (3), when a coefficient of the fourth-order term of the frequency ω in the formula (1) is larger than that of the second-order term, the attenuation rate is increased. On the other hand, in the region (2), when the coefficient of the fourth-order term is smaller than that of the second-order term, the attenuation rate is increased. Therefore, a request in the regions (1) and (3) is contrary to a request in the region (2), and thus there is not a solution that maximizes the attenuation rate in all regions. However, the following matters are found from Table 1 and FIG. 3.

When $L_{1M}=L_{2M}$ (that is equivalent to $L_1=L_2$) and $C_1=C_S$, two resonance frequencies $\omega_{R\_LOW}$ and $\omega_{R\_HIGH}$ approach to each other, so that the region (2) can be reduced.

The frequency band of the region (3) is larger than that of the region (2).

The attenuation rate in the region (2) can be attenuated by control.

Accordingly, if a condition of maximizing the attenuation rate is satisfied, that is, $L_1=L_2$ and $C_1=C_S$ are satisfied in the region (3), in practice, the attenuation rate of a noise current can be maximized. The simulation result of FIG. 3 also represents effects of improvement in the attenuation rate in the region (3) due to $L_1=L_2$.

When inductances of the first and second filter reactors (51a and 51b) are made equal to each other, other problems from different viewpoints occur. These problems are described with reference to FIGS. 4 to 8.

Figure 4:
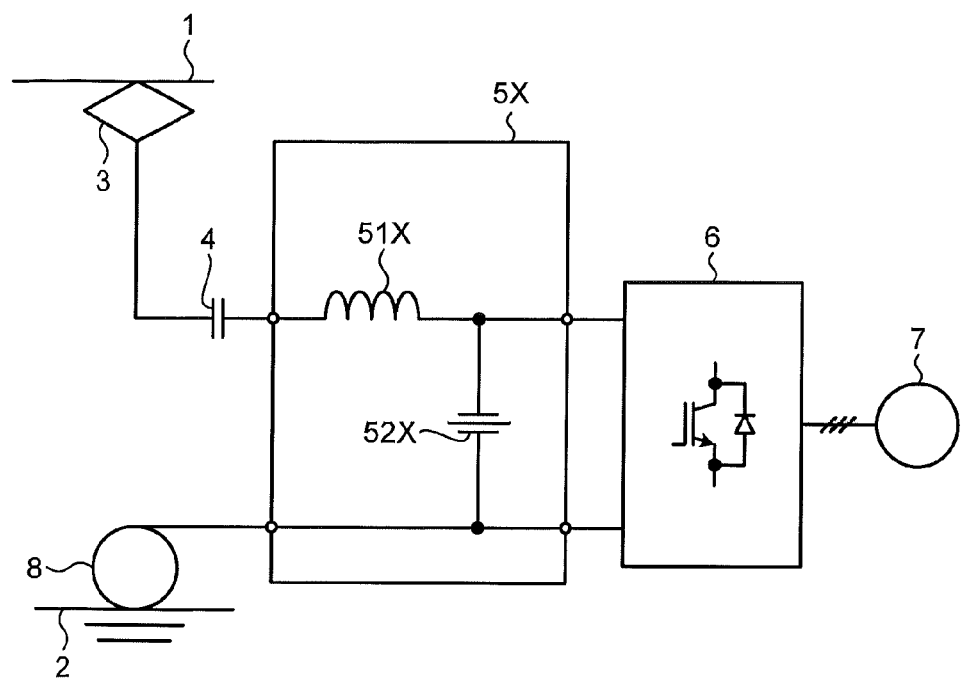

FIG. 4 is a diagram illustrating a configuration of an electric-vehicle drive controller disclosed in Patent Literature 1 listed above and the like. The electric-vehicle drive controller illustrated in FIG. 4 includes a single-stage filter device 5X constituted by a filter reactor 51X and a filter capacitor 52X.

Figure 5:
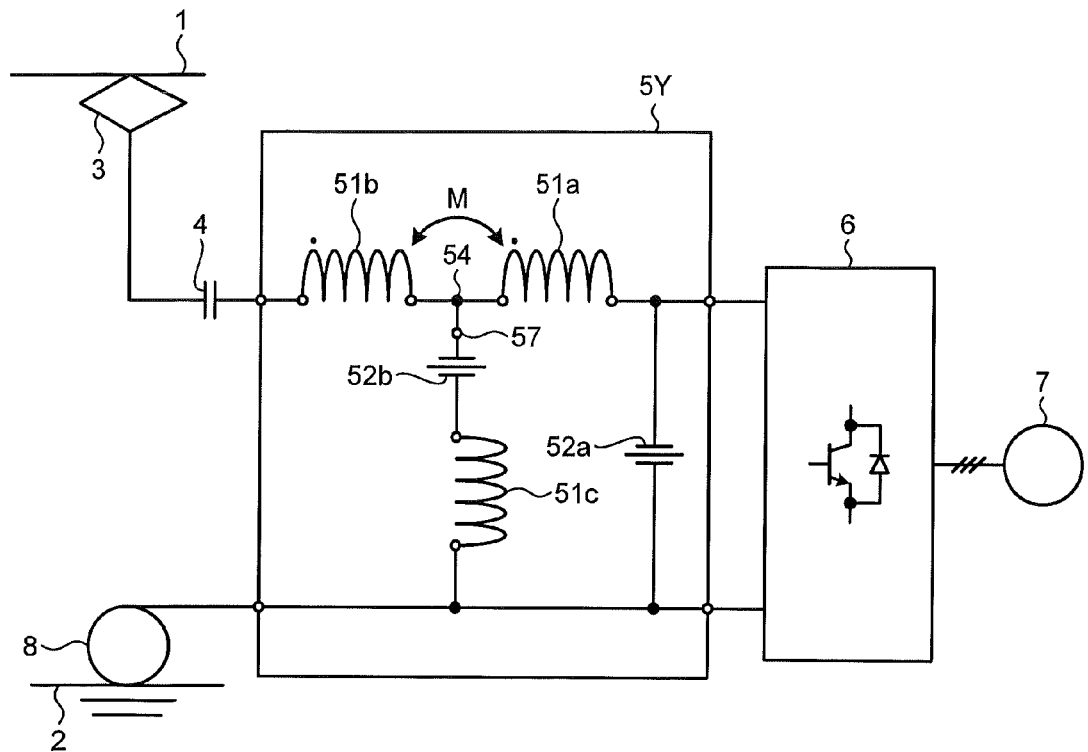
FIG. 5 is a diagram illustrating a configuration of an electric-vehicle drive controller disclosed in Patent Literature 2.

FIG. 5 is a diagram illustrating a configuration of the electric-vehicle drive controller disclosed in Patent Literature 2 listed above. In a filter device 5Y of the electric-vehicle drive controller illustrated in FIG. 5, constituent parts denoted by same reference signs are identical to those of the filter device 5 according to the first embodiment described above. The filter device 5Y is different from the filter device 5 according to the first embodiment in that the fuse 53 serving as a circuit disconnecting unit is not provided in the filter device 5Y.

Figure 6:
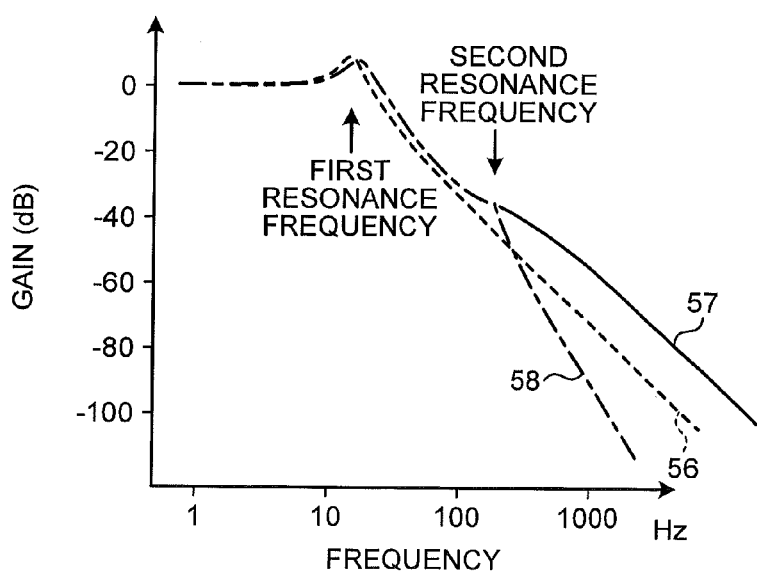
FIG. 6 is an explanatory diagram of a filter characteristic of the filter device illustrated in FIG. 5.

FIG. 6 is an explanatory diagram of a filter characteristic of the filter device 5Y illustrated in FIG. 5, and is a diagram (a graph) illustrating a gain (an attenuation rate) that indicates a degree to which a noise current generated by an inverter remains in a direct-current overhead line current. The single-stage filter illustrated in FIG. 4 has a characteristic indicated by a broken line 56; however, if the single-stage filter is merely changed to a double-stage filter by using magnetically coupled filter reactors, the gain characteristic in a high-frequency range is degraded as indicated by a solid line 57, because of a negative equivalent inductance generated by magnetic coupling. When the third filter reactor 51c that cancels the negative equivalent inductance is connected as described in the invention of the present application and as illustrated in FIG. 5, the gain characteristic in the high-frequency range is improved to be a gain characteristic that is originally intended for a double-stage filter.

Figure 7:
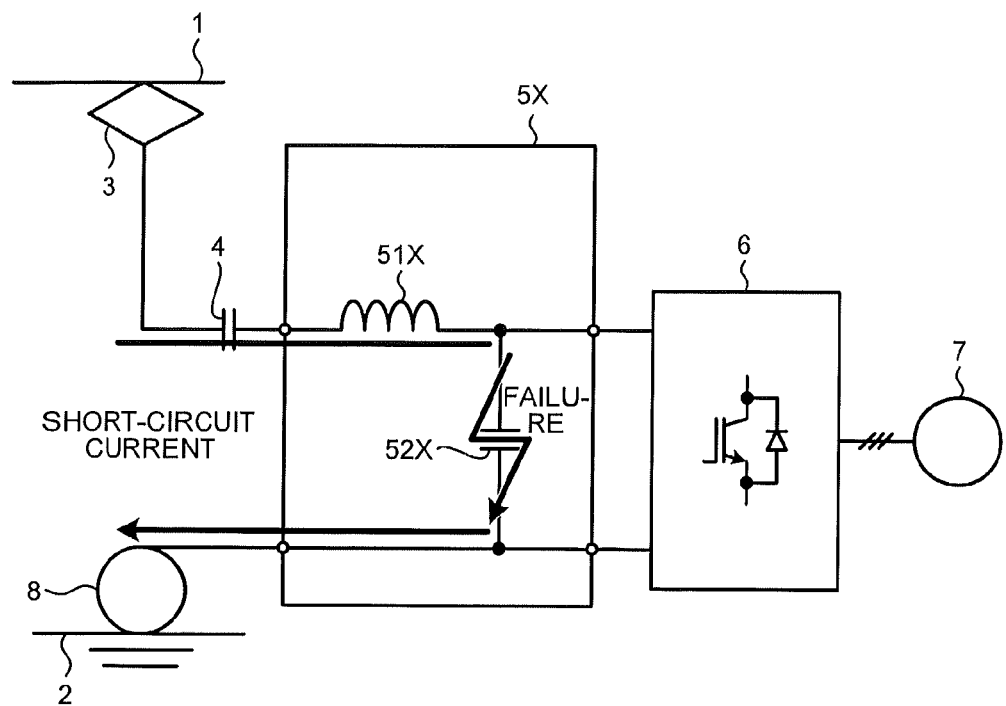
FIG. 7 is an explanatory diagram of a case where a short-circuit fault has occurred in a capacitor of the electric-vehicle drive controller illustrated in FIG. 4 and then a short-circuit current flows.
Figure 8:
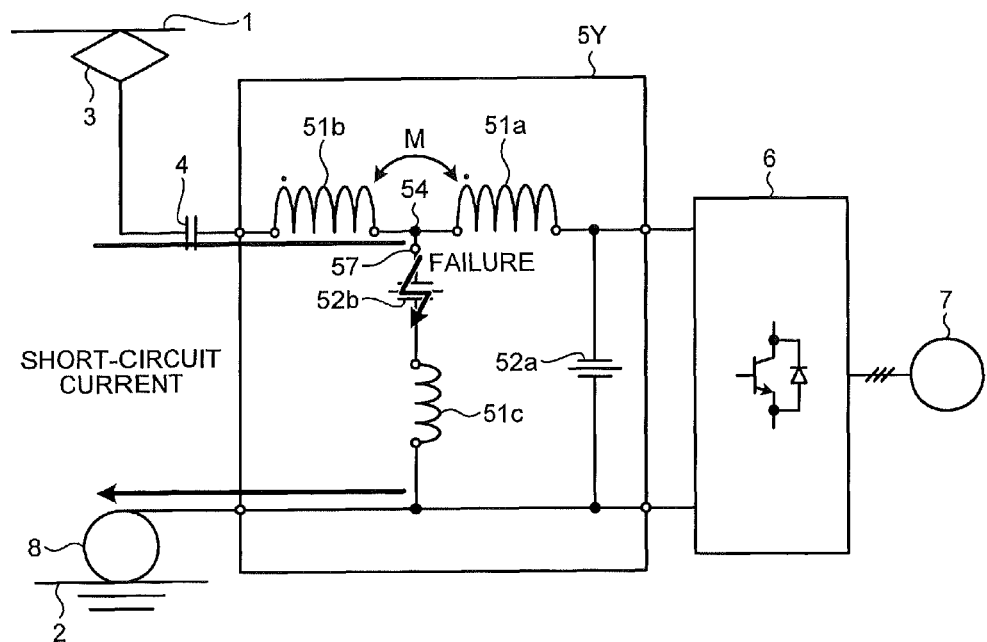
FIG. 8 is an explanatory diagram of a case where a short-circuit fault has occurred in a capacitor on an overhead-line side of the electric-vehicle drive controller illustrated in FIG. 5 and then a short-circuit current flows.

FIG. 7 is an explanatory diagram of a case where a short-circuit fault has occurred in a capacitor of the electric-vehicle drive controller illustrated in FIG. 4 and then a short-circuit current flows. FIG. 8 is an explanatory diagram of a case where a short-circuit fault has occurred in a capacitor on an overhead-line side of the electric-vehicle drive controller illustrated in FIG. 5 and then a short-circuit current flows. In a case of the filter device 5X that is a single-stage filter, as illustrated in FIG. 7, even when a short-circuit fault has occurred in the inverter 6 or the filter capacitor 52X, the filter reactor 51X is sufficiently large and thus it is possible to suppress the speed at which the short-circuit current generated at the time of the fault increases. As a result, the circuit breaker 4 can block the short-circuit current before the short-circuit current becomes large enough to cause.

Also in the double-stage filter device 5Y illustrated in FIG. 5, when a short-circuit fault occurs in the first filter capacitor 52a, a current flowing in the first filter capacitor 52a at which the short-circuit fault has occurred flows in the first and second filter reactors (51a and 51b), and thus the state of the double-stage filter device 5Y becomes identical to that of the single-stage filter device 5 illustrated in FIG. 4. As a result, no serious problem occurs.

On the other hand, as illustrated in FIG. 8, a short-circuit current that flows when a short-circuit fault has occurred in the second filter capacitor 52b flows without passing through the first filter reactor 51a. Therefore, the operation of suppressing the short-circuit current is performed by the second filter reactor 51b and the third filter reactor 51c.

However, if the number of turns of the first filter reactor 51a is equal to that of the second filter reactor 51b and a coupling coefficient of a magnetic circuit sufficiently approximates 1, $L_1=L_2=M$ is established. Therefore, the sum L of inductances of the first filter reactor 51a and the second filter reactor 51b is as follows.

$$L=L_{1M}+L_{2M}=L_1+L_2+2M=4L_1=4L_2=4M$$

If the above formula is deformed, the following formula is obtained.

$$L_1=L_2=M=L/4$$

That is, assuming that the sum L of inductances is equal to an inductance of a single-stage reactor, each of the self-inductance $L_1$ of the first filter reactor 51a, the self-inductance $L_2$ of the second filter reactor 51b, and the mutual inductance M is equal to ¼ of the inductance L in the case of a single-stage reactor. This theory can also be understood as follows. In order to obtain an inductance that is the same as that of a single-stage reactor, it suffices that the number of turns of the first filter reactor 51a and the second filter reactor 51b is made half the number of turns in the case of the single-stage reactor. Because the inductance is proportional to the square of a turn ratio, a self-inductance and a mutual inductance are equal to ¼.

Because the inductance of the third filter reactor 51c is set to be approximately the same as (substantially equal to) the mutual inductance M, the inductance is approximately ¼. Therefore, the sum of the inductance of the second filter reactor 51b and the inductance of the third filter reactor 51c is approximately ½ of the inductance in the case of the single-stage reactor. Therefore, an increase rate of a current flowing in the second filter capacitor 52b at which a short-circuit fault has occurred is approximately twice the increase rate in the case where a short-circuit fault occurs in the first filter capacitor 52a. As a result, as compared to the case where a short-circuit fault occurs in the first filter capacitor 52a, the possibility of accidentally operating a circuit breaker of a system on a higher level than the circuit breaker 4 becomes higher. When the circuit breaker of a higher-level system is accidentally operated, power supply to other electric vehicles is also stopped, so that the vehicle operation of an entire railway company is greatly hindered.

Accordingly, when the double-stage filter illustrated in FIG. 5 is used, according to the conventional concept, it is necessary to set the inductance of the second filter reactor 51b sufficiently larger than that of the first filter reactor 51a. However, even when the inductance of the second filter reactor 51b is larger than that of the first filter reactor 51a, an optimal noise-current suppression effect cannot be obtained.

Therefore, in order to obtain an optimal noise-current suppression effect while assuming a short-circuit fault of the second filter capacitor 52b, it is conceivable to use a filter reactor having a large capacitance for the third filter reactor 51c and a filter reactor having a large inductance for the first and second filter reactors (51a and 51b). However, this concept is not desirable because the size of the filter reactor and the filter capacitor is increased.

On the other hand, in the filter device according to the first embodiment, the fuse 53 that is connected to the second filter capacitor 52b in series and serves as a circuit disconnecting unit is connected between the intermediate tap 57 and the low-potential side bus 55b. Therefore, even when a short-circuit fault occurs in the second filter capacitor 52b that is a capacitance element connected without having a sufficiently large inductance element between the overhead line 1 serving as a power supply source and the second filter capacitor 52b itself, a short-circuit current flowing through the second filter capacitor 52b can be quickly blocked by the fuse 53.

In a case of an electric vehicle, main-circuit current of an inverter generally reaches to a rated current of hundreds of amperes. Meanwhile, a current from the intermediate tap 57 is several to tens of amperes at the most (equal to or less than 1/10 of the rating), and thus the rated current of the fuse 53 can be sufficiently reduced. Accordingly, for example, the rated current of the fuse 53 may be set to be equal to or larger than approximately 1/20 of the maximum current flowing in the circuit breaker 4 and equal to or less than 1/10 thereof. In this case, as soon as a short-circuit current is generated, the fuse 53 itself is quickly melted and thus the short-circuit current can be blocked, so that influences of a circuit operation on the inverter 6 and the motor 7 can be reduced, and the reliability of an electric-vehicle system can be improved.

When the fuse 53 is melted, it is possible to immediately determine that it is not a fault of the inverter 6 or the motor 7 but a short-circuit fault of the second filter capacitor 52b, and thus recovery of a device can be immediately performed. Note that it is easy to determine whether the fuse 53 has been melted. For example, it can be determined by monitoring an end-to-end voltage of the fuse 53.

In the filter device according to the first embodiment, even when it is configured as a double-stage filter device, it is not necessary to increase inductances of the first and second filter reactors (51a and 51b) and these inductances can be set to be equal to each other. Accordingly, the filter device can be downsized while securing a required filter characteristic.

In the filter device according to the first embodiment, the first filter reactor is magnetically coupled to the second filter reactor, and thus the number of turns required for obtaining the same inductance value can be less than that in a case where the first filter reactor is not magnetically coupled to the second filter reactor, and the first and second filter reactors can be downsized. The size of a third filter reactor that becomes necessary because of magnetic coupling is much smaller than that of the first filter reactor and the second filter reactor. As a result, the effect of downsizing the first and second filter reactors is larger and the overall filter device can be downsized. The size of the third filter reactor is small because a flowing current is equal to or less than 1/10, and thus the diameter of a winding can be reduced.

Even when the fuse 53 is melted, the noise attenuation characteristic is made equivalent to that of a single-stage filter. Accordingly, if a certain measure, for example, selecting a time slot where influences of noise are small or the like is taken, a vehicle can travel by itself, and thus influences on the vehicle operation by a railway company can be minimized.

When it is detected that the fuse 53 has been melted, as long as the circuit breaker 4 on a path for supplying power to an electric-vehicle drive controller including the melted fuse (or a vehicle having the electric-vehicle drive controller incorporated therein) is opened, a vehicle can travel by operating other electric-vehicle drive controllers where no fault has occurred, and influences on the vehicle operation by a railway company can be minimized.

The present invention can be applied not only to a double-stage filter device but also to a case in which a specified frequency bypass filter that includes an inductance element and a capacitance element for improving an attenuation rate of a noise current in a specified frequency region is connected without having a sufficiently large inductance element between a power supply source and the bypass filter itself, and identical effects can be achieved. This same holds true for the following embodiments.

Second Embodiment

The first embodiment has described an electric-vehicle drive controller that uses a double-stage filter device in which a first reactor and a second filter reactor are magnetically coupled to each other. A second embodiment describes a case of using a double-stage filter including a first filter reactor and a second filter reactor that are not magnetically coupled to each other.

Figure 9:
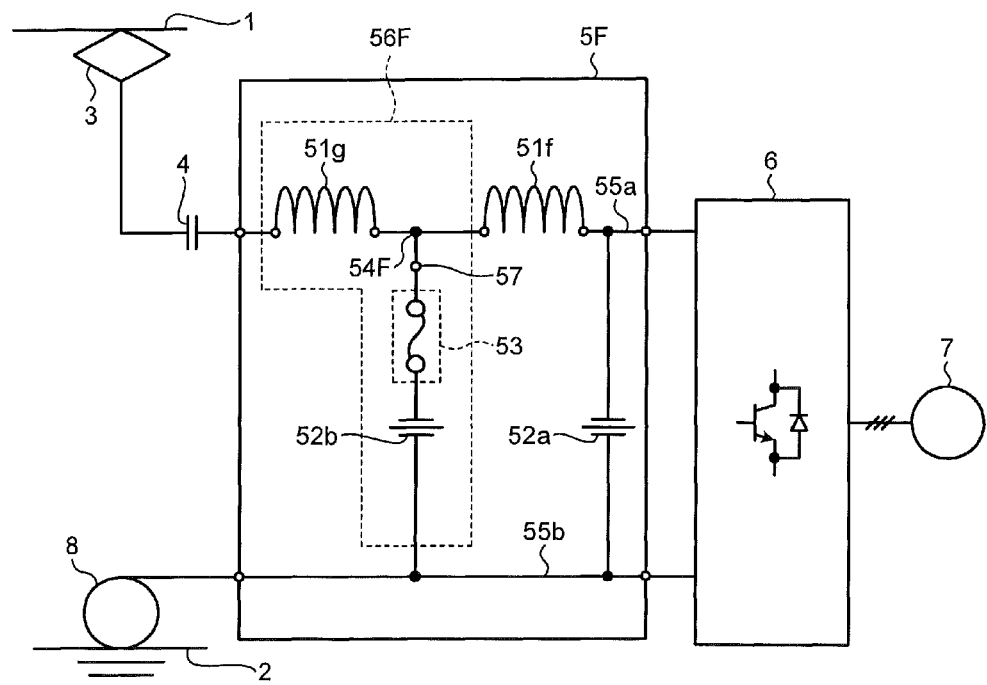
FIG. 9 is a diagram illustrating a configuration example of an electric-vehicle drive controller according to a second embodiment of the present invention.

FIG. 9 is a diagram illustrating a configuration example of an electric-vehicle drive controller according to the second embodiment of the present invention. Only features that are different from the first embodiment in FIG. 1 are described here. A filter device 5F includes a first filter reactor 51f and a second filter reactor 51g that are not magnetically coupled to each other. The inductance value of the first filter reactor 51f is equal to that of the second filter reactor 51g. The fuse 53 and the second filter capacitor 52b are connected in series between a connection point 54F of the first filter reactor 51f and the second filter reactor 51g and the low-potential side bus 55b. Because the first filter reactor 51f is not magnetically coupled to the second filter reactor 51g, the filter device 5F does not have a coupling compensation inductance element that compensates a negative equivalent inductance component generated due to magnetic coupling.

A series circuit unit 56F includes the second filter reactor 51g (inductance element), the fuse 53 (circuit disconnecting unit), and the second filter capacitor 52b (capacitance element) that are connected in series. One end of the first filter reactor 51*f* on a side of a power supply source of direct-current power is connected to the series circuit unit 56F at the connection point 54F of the first filter reactor 51*f* and the second filter reactor 51*g*.

Operations of the second embodiment are identical to those of the first embodiment. The fuse 53 that is connected to the second filter capacitor 52*b* in series and serves as a circuit disconnecting unit is connected between the intermediate tap 57 and the low-potential side bus 55*b*. Accordingly, even when a short-circuit fault occurs in the second filter capacitor 52*b*, a short-circuit current flowing through the second filter capacitor 52*b* can be quickly blocked by the fuse 53. Therefore, the inductance value of the first filter reactor 51*f* can be made equal to that of the second filter reactor 51*g* and the attenuation characteristic in a high-frequency region can be improved.

Third Embodiment

Figure 10:
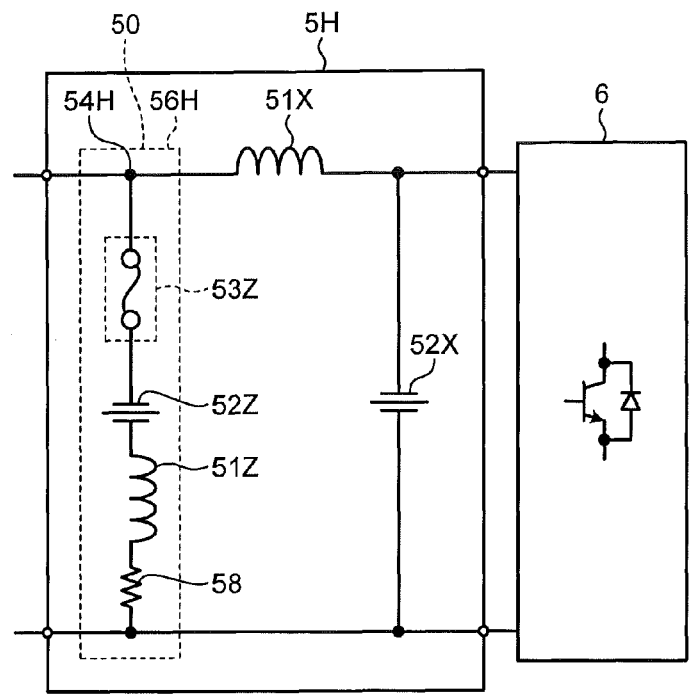
FIG. 10 is a diagram illustrating an example of a case where a specified-frequency bypass filter is inserted to be closer to an overhead-line side than a filter reactor, in a single-stage filter device.
Figure 11:
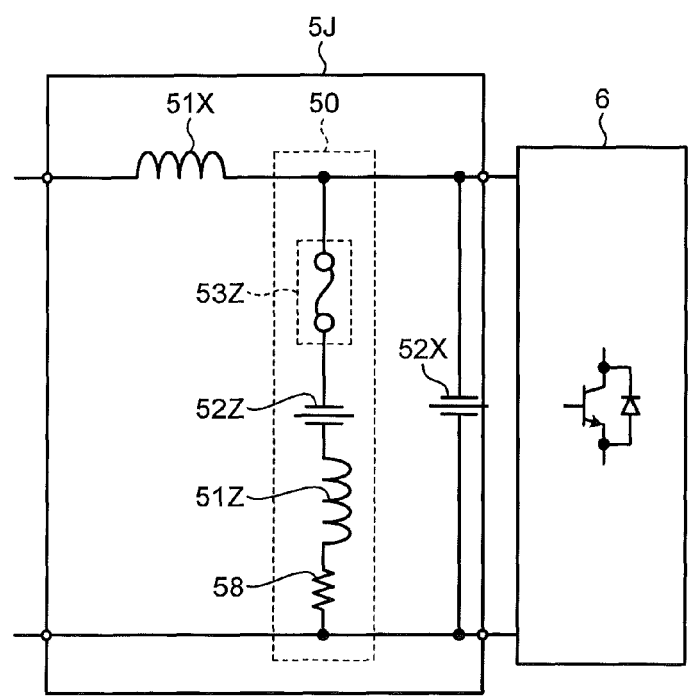
FIG. 11 is a diagram illustrating an example of a case where the specified-frequency bypass filter is inserted to be closer to a load side than the filter reactor, in a single-stage filter device.
Figure 12:
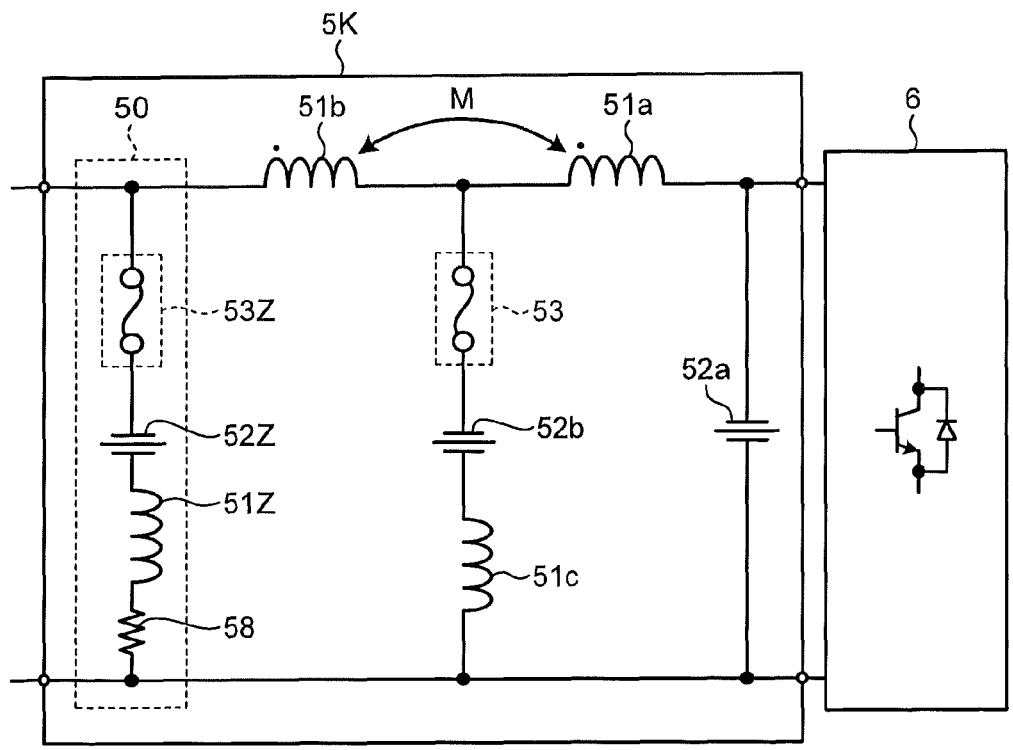
FIG. 12 is a diagram illustrating an example of a case where the specified-frequency bypass filter is inserted to be closer to an overhead-line side than a second filter reactor, in a double-stage filter device using filter reactors that are magnetically coupled to each other.
Figure 13:
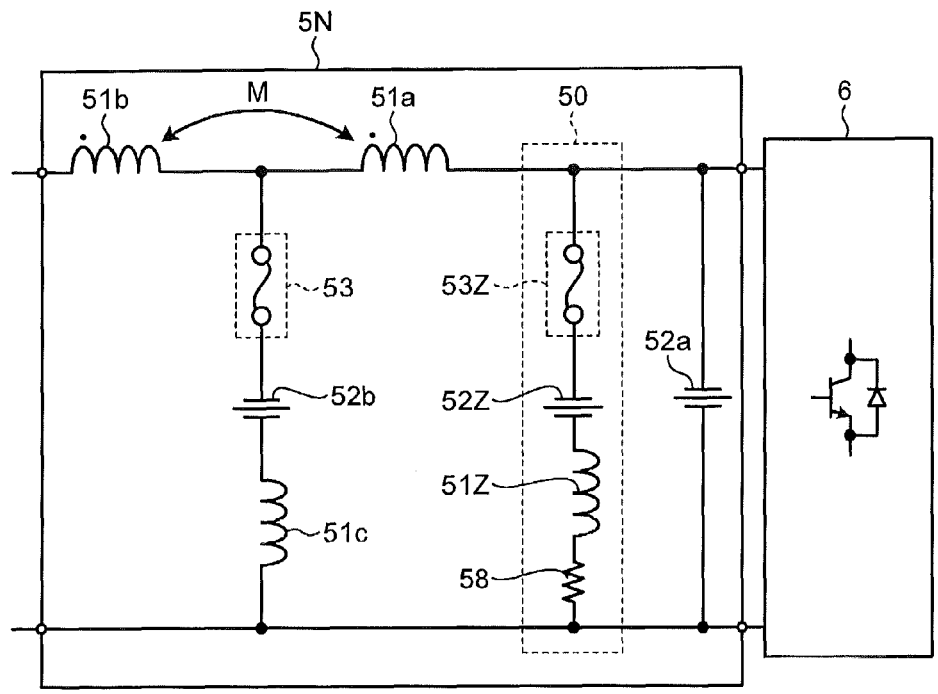
FIG. 13 is a diagram illustrating an example of a case where the specified-frequency bypass filter is inserted to be closer to a load side than a first filter reactor, in a double-stage filter device using filter reactors that are magnetically coupled to each other.
Figure 14:
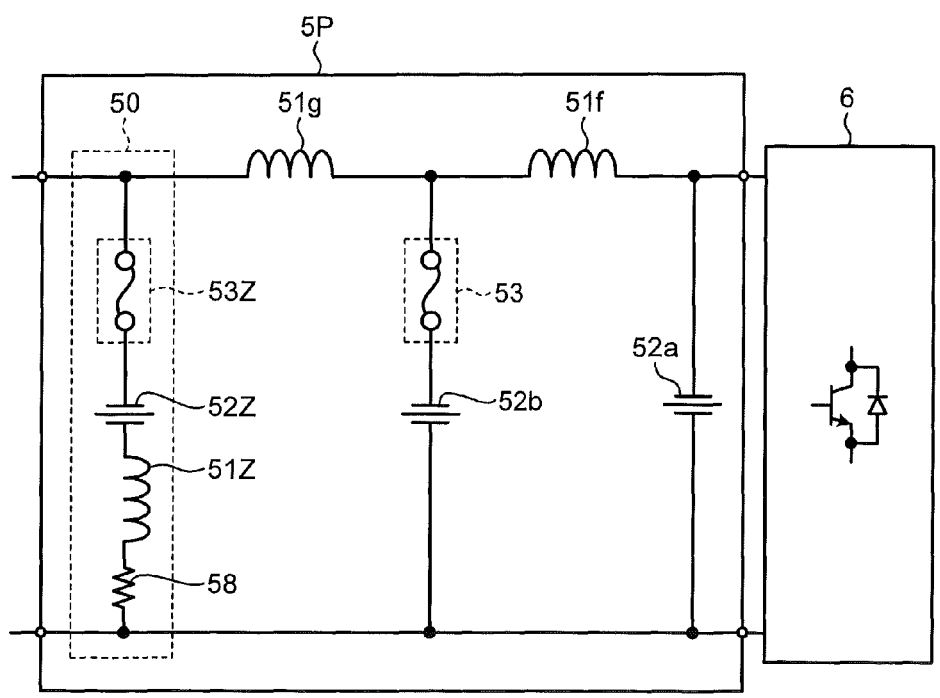
FIG. 14 is a diagram illustrating an example of a case where the specified-frequency bypass filter is inserted to be closer to an overhead-line side than a second filter reactor, in a double-stage filter device using filter reactors that are not magnetically coupled to each other.
Figure 15:
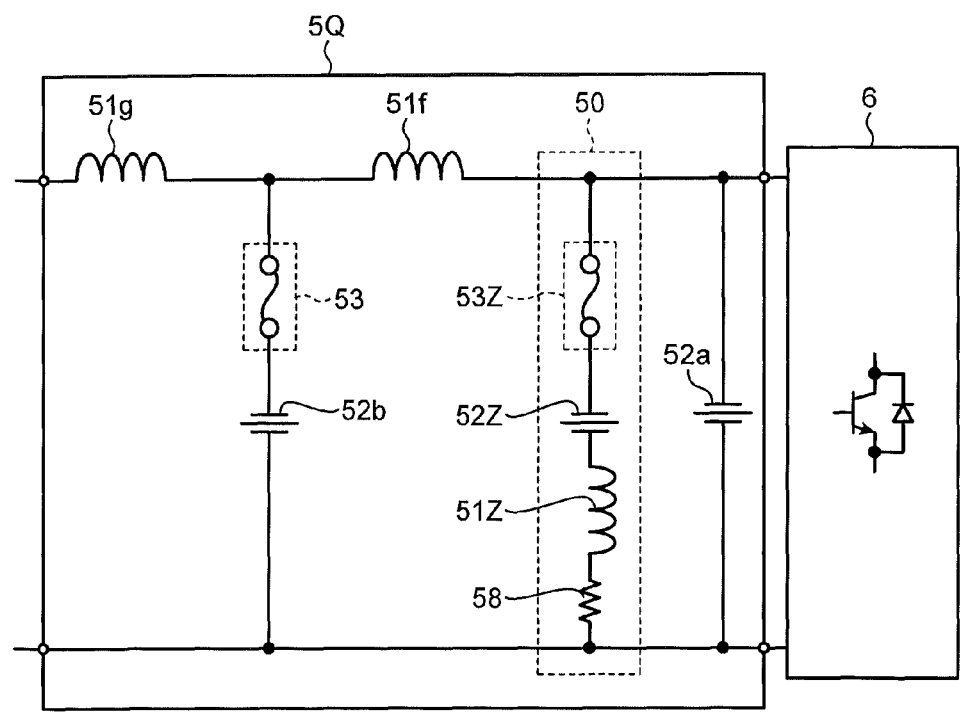
FIG. 15 is a diagram illustrating an example of a case where the specified-frequency bypass filter is inserted to be closer to a load side than a first filter reactor, in a double-stage filter device using filter reactors that are not magnetically coupled to each other.

In a filter device, in order to improve the attenuation rate of a noise current in a specified frequency region, for example, a specified-frequency bypass filter 50 illustrated FIGS. 10 to 15 may be connected. In this case, by appropriately selecting a capacitor and a reactor that constitute the specified-frequency bypass filter 50 that bypasses a noise current of a specified frequency and removes the noise current, the frequency to be attenuated can be caused to match a specified frequency and a desired amount of attenuation can be obtained. A filter device 5H illustrated in FIG. 10 is an example of a case in which the specified-frequency bypass filter 50 is inserted to be closer to an overhead-line side than a filter reactor 51X, in a single-stage filter device. A filter device 5J illustrated in FIG. 11 is an example of a case where the specified-frequency bypass filter 50 is inserted to be closer to a load side than the filter reactor 51X. A filter device 5K illustrated in FIG. 12 is an example of a case where the specified-frequency bypass filter 50 is inserted to be closer to an overhead line (a system) side than a second filter reactor 51*b*, in a double-stage filter device using filter reactors that are magnetically coupled to each other. A filter device 5N illustrated in FIG. 13 is an example of a case where the specified-frequency bypass filter 50 is inserted to be closer to a load side than a first filter reactor 51*a*. A filter device 5P illustrated in FIG. 14 is an example of a case where the specified-frequency bypass filter 50 is inserted to be closer to an overhead line (a system) side than a second filter reactor 51*g*, in a double-stage filter device using filter reactors that are not magnetically coupled to each other. A filter device 5Q illustrated in FIG. 15 is an example of a case where the specified-frequency bypass filter 50 is inserted to be closer to a load side than a first filter reactor 51*f*.

In the specified-frequency bypass filter 50, a fuse 53Z serving as a bypass-circuit disconnecting unit, a bypass capacitor 52Z serving as a bypass capacitance element, a bypass reactor 51Z serving as a bypass inductance element, and a current-limiting resistor 58 that prevents a noise current of a specified frequency from flowing too much are connected in series. An inductance value of the bypass reactor 51Z and a capacitance value of the bypass capacitor 52Z are determined by the magnitude of a specified frequency and that of a flowing noise current.

In the filter device 5H illustrated in FIG. 10, the specified-frequency bypass filter 50 is also a series circuit unit 56H. The fuse 53Z is a circuit disconnecting unit, the bypass reactor 51Z is also an inductance element of a series circuit unit, and the bypass capacitor 52Z is also a capacitance element. A connection point 54H where one end of the first filter reactor 51X on a side of a power supply source is connected to one end of the series circuit unit 56H is a point where one end of the fuse 53Z is connected to the first filter reactor 51X.

When the fuse 53Z is cut, the bypass capacitor 52Z and the bypass reactor 51Z have a low potential and an operation is easily performed, and thus it is desirable to provide the fuse 53Z on a high-potential side.

Figure 16:
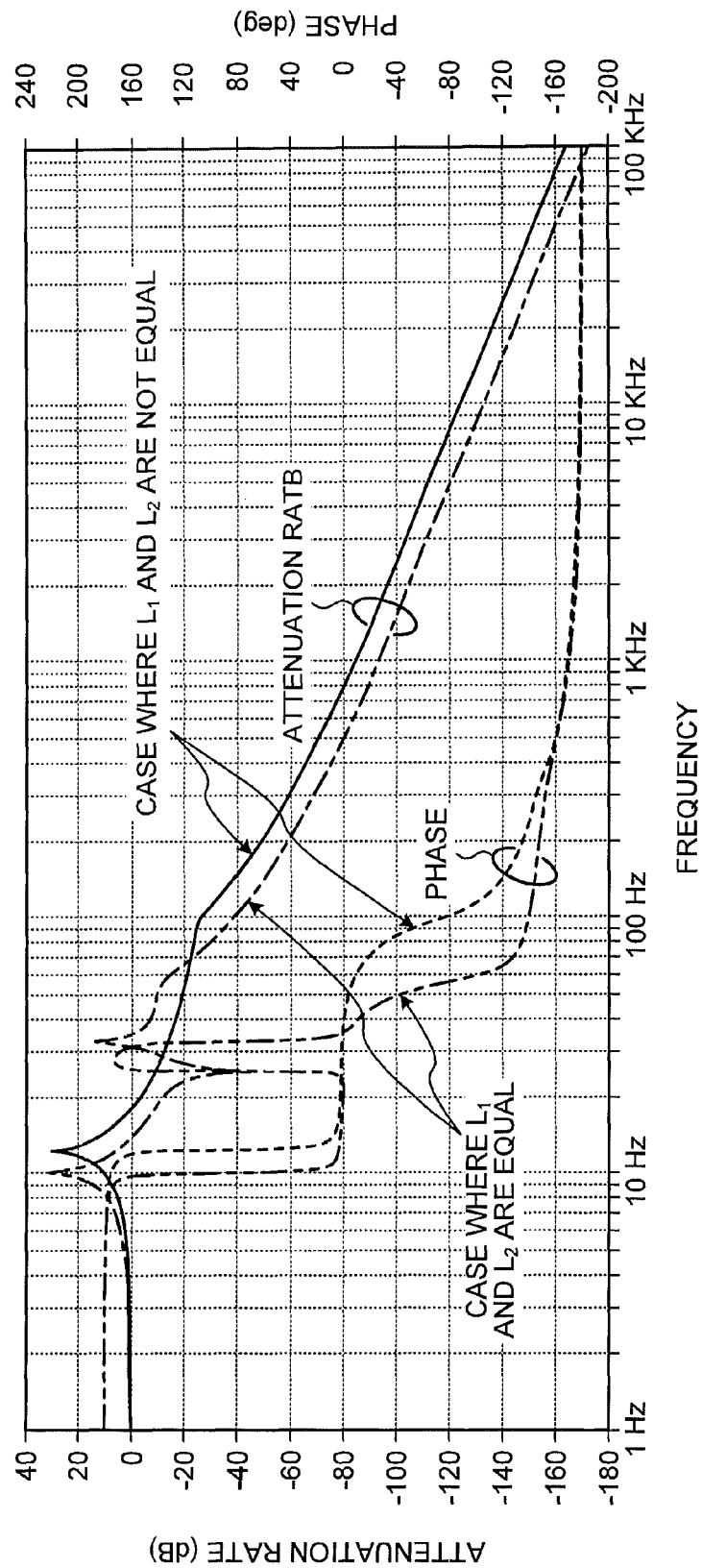
FIG. 16 is a diagram illustrating a filter characteristic in which an attenuation rate at approximately 25 hertz is improved in the filter device illustrated in FIG. 12.

For example, when $L_1$ and $L_2$ are made equal in a double-stage filter as illustrated in FIG. 3, a noise current on a high-frequency side can be attenuated; however, a noise current is increased on a low-frequency side (approximately 15 hertz to 60 hertz in the example of FIG. 3). For example, if there is a signal device that malfunctions by a noise of approximately 25 hertz and the like, it is desirable to have a filter device having a large attenuation rate at approximately 25 hertz. In such a case, for example, if the specified-frequency bypass filter 50 is connected as illustrated in FIG. 12, the filter characteristic can obtain a desired attenuation rate at approximately 25 hertz as indicated by a one-dot chain line in FIG. 16.

There is a case of connecting the specified-frequency bypass filter 50 to be closer to a system side than the filter reactor 51X or the first and second filter reactors (51*a* and 51*b*), depending on the application of the specified-frequency bypass filter 50 (examples of FIGS. 10, 12, and 14). In such a case, in order to solve the problem of a short-circuit current at the time of a fault of a capacitor described above, a fuse needs to be connected to a capacitor in series. As the fuse 53Z is connected to the bypass capacitor 52Z in series, even when a short-circuit fault occurs in the bypass capacitor 52Z, a short-circuit current flowing through the bypass capacitor 52Z can be blocked by the fuse 53Z more quickly.

Furthermore, even when the specified-frequency bypass filter 50 is connected to be closer to a load side than the filter reactor 51X or the first and second filter reactors (51*a* and 51*b*) (examples of FIGS. 11, 13, and 15), it is preferable to connect a fuse. As a fuse is provided in the specified-frequency bypass filter 50, a malfunction of a filter element of the specified-frequency bypass filter 50 can be distinguished from a malfunction of the inverter 6, and thus the reliability of an electric-vehicle system can be improved, and influences on the vehicle operation can be minimized.

Fourth Embodiment

A fourth embodiment describes a relation between the material of a switching element used for the inverter 6 and the filter characteristic. An element (a Si element) made of silicon (Si) is generally used for the switching element used for the inverter 6. Recently, instead of this Si element, a switching element (SiC element) made of silicon carbide (SiC) has attracted attention.

The SiC element has characteristics superior to the Si element. Such characteristics include a larger thermal conductivity, availability of an operation at a high temperature, and a small switching loss even when a switching frequency is increased. However, if the SiC element is used, it is thought that a high-frequency noise is increased.

Meanwhile, as compared to a single-stage filter, the double-stage filter described above has a smaller noise attenuation rate on a high-frequency side but a larger noise attenuation rate on a low-frequency side. Therefore, increase of the switching frequency by using a SiC element makes the importance of the filter device using a double-stage filter according to the present embodiment more significant.

Increase of a high-frequency noise is a very important issue for the filter device for an electric-vehicle drive controller according to the present embodiment, because the increase exerts a large influence on signal devices and safety devices. However, the double-stage filter according to the present embodiment has an excellent attenuation characteristic on a high-frequency side, and thus the filter matches the recent technical trend of using a SiC element.

As described above, in the filter device using a double-stage filter according to the present embodiment, when a SiC element is used as the switching element of the inverter 6, it is preferable to utilize the characteristics of the SiC element, and it becomes possible to benefit from the SiC element.

SiC is characterized by a wider bandgap than Si, and thus SiC is an example of semiconductors referred to as "wide bandgap semiconductors". In addition to SiC, for example, the wide bandgap semiconductors also include a gallium nitride material and a semiconductor formed of diamond, and thus it is also possible to use wide bandgap semiconductors other than those made of SiC.

The configuration of the first to third embodiments described above is only an example of the configuration of the present invention. The configuration can be combined with other well-known techniques, and it is needless to mention that the present invention can be configured while modifying it without departing from the scope of the invention, such as omitting a part of the configuration.

Furthermore, in the embodiments described above, while the contents of the present invention have been described assuming that the filter device that is applied to an electric-vehicle drive controller is used, the application field of the invention is not limited thereto. The present invention can be widely applied to a configuration that includes a filter device being interposed between a circuit breaker that is provided on a direct-current bus on a high-voltage side and an inverter at the time of receiving direct-current power from a power supply source, thereby being operated to prevent a noise current from flowing out from the inverter to a side of the power supply source.

INDUSTRIAL APPLICABILITY

As described above, the present invention is useful as a filter device for an electric-vehicle drive controller.

REFERENCE SIGNS LIST 1 overhead line, 2 rail, 3 power collector, 4 circuit breaker, 5, 5X, 5Y, 5F, 5H, 5J, 5K, 5N, 5P, 5Q filter device, 6 inverter, 7 motor, 50 specified-frequency bypass filter, 51a first filter reactor, 51b second filter reactor, 51c third filter reactor, 51X filter reactor, 51Z bypass reactor, 52a first filter capacitor, 52b second filter capacitor, 52X filter capacitor, 52Z bypass capacitor, 53, 53Z fuse, 54, 54F, 54H connection point, 55a high-potential side bus, 55b low-potential side bus, 56, 56F, 56H series circuit unit, intermediate tap, 58 current-limiting resistor.

The invention claimed is:

1. A filter device that is provided between an overhead line and an inverter that receives power from the overhead line, the filter device comprising:
a first filter capacitor that is provided in parallel to a direct-current unit of the inverter between a high-potential side bus of the direct-current unit of the inverter and a low-potential side bus of the direct-current unit of the inverter;
a second filter capacitor that is provided to be closer to a side of the overhead line than the first filter capacitor and that is provided in parallel to the first filter capacitor between the high-potential side bus and the low-potential side bus;
a first filter reactor that is provided on the high-potential side bus between the first filter capacitor and the second filter capacitor;
a second filter reactor that is provided on the high-potential side bus between the second filter capacitor and the overhead line, and is magnetically coupled to the first reactor;
a circuit disconnecting unit that is serially connected to the second filter capacitor between a connection point of the first filter reactor and the second filter reactor that are magnetically coupled to each other and the low-potential side bus; and
a specified-frequency bypass filter that removes a noise current of a specified frequency, in which a bypass circuit disconnecting unit, a bypass inductance element, and a bypass capacitance element are connected in series, wherein
the specified-frequency bypass filter is provided between the high-potential side bus and the low-potential side bus, and is provided in parallel to the first filter capacitor and the second filter capacitor, where one end of the specified-frequency bypass filter is connected between the overhead line and the second filter reactor or between a high-potential side of the first filter capacitor and the first filter reactor and the other end of the specified-frequency bypass filter is connected to the low-potential side bus,
the circuit disconnecting unit disconnects between the connection point of the first filter reactor and the second filter reactor and the low-potential side bus when a current larger than a rated current flows in the circuit disconnecting unit, and the circuit disconnecting unit blocks a short-circuit current flowing through the second filter capacitor; and
the bypass circuit disconnecting unit disconnects between the one end of the specified-frequency bypass filter and the other end of the specified-frequency bypass filter when a current larger than a rated current flows in the bypass circuit disconnecting unit, and the bypass circuit disconnecting unit blocks a short-circuit current flowing through the bypass capacitance element.

2. The filter device according to claim 1 that is connected to a circuit breaker provided between the overhead line and the second filter reactor, wherein
the rated current of the circuit disconnecting unit is smaller than a rated current of the circuit breaker that is provided between the overhead line and the second filter reactor.

3. The filter device according to claim 1, wherein the circuit disconnecting unit is provided on a high-potential side of the second filter capacitor.

4. The filter device according to claim 1, wherein an inductance value of the first filter reactor is substantially equal to an inductance value of the second filter reactor.

5. The filter device according to claim 1, comprising a coupling compensation inductance element that is connected in parallel to the first filter capacitor and connected to the second filter capacitor and the circuit disconnecting unit in series between the high-potential side bus and the low-potential side bus.

6. The filter device according to claim 1, wherein
a part of a reactor with an intermediate tap having an intermediate tap, which is on a side closer to the inverter with respect to the intermediate tap, is the filter reactor, and
a part of the reactor with an intermediate tap, which is on a side closer to the overhead line with respect to the intermediate tap, is the second filter reactor.

7. An electric-vehicle drive controller comprising:
the inverter;
the filter device according to claim 1; and
a motor that is driven by the inverter.

8. The filter device according to claim 2, wherein the rated current of the circuit disconnecting unit is equal to or larger than $1/20$ of a maximum current flowing in the circuit breaker and equal to or less than $1/10$ of the maximum current.

9. The filter device according to claim 5, wherein an inductance of the coupling compensation inductance element is substantially equal to a mutual inductance between the first filter reactor and the second filter reactor.

10. The electric-vehicle drive controller according to claim 7, wherein even when it is detected that the circuit disconnecting unit is operated, the motor is driven by the inverter to execute propulsion control of an electric vehicle.

11. The electric-vehicle drive controller according to claim 7, including a circuit breaker that is serially provided on a side closer to the power supply source than the inductance element, wherein
when it is detected that the circuit disconnecting unit is operated, the circuit breaker is opened.

12. The electric-vehicle drive controller according claim 7, wherein a switching element of the inverter is formed of a wide bandgap semiconductor.

13. The electric-vehicle drive controller according to claim 12, wherein the wide bandgap semiconductor is a semiconductor using silicon carbide, a gallium nitride material, or diamond.

14. A filter device that is provided between an overhead line and an inverter that receives power from the overhead line, the filter device comprising:
a first filter capacitor that is provided in parallel to a direct-current unit of the inverter between a high-potential side bus of the direct-current unit of the inverter and a low-potential side bus of the direct-current unit of the inverter;
a second filter capacitor that is provided to be closer to a side of the overhead line than the first filter capacitor and that is provided in parallel to the first filter capacitor between the high-potential side bus and the low-potential side bus;
a first filter reactor that is provided on the high-potential side bus between the first filter capacitor and the second filter capacitor;
a second filter reactor that is provided on the high-potential side bus between the second filter capacitor and the overhead line, and is magnetically coupled to the first filter reactor; and
a circuit disconnecting unit that is serially connected to the second filter capacitor between a connection point of the first filter reactor and the second filter reactor that are magnetically coupled to each other and the low-potential side bus, wherein
the circuit disconnecting unit disconnects between the connection point of the first and second filter reactors and the low-potential side bus when a current larger than a rated current flows in the circuit disconnecting unit, and the circuit disconnecting unit blocks a short-circuit current flowing through the second filter capacitor, and
a coupling compensation inductance element is connected in parallel to the first filter capacitor and is serially connected to the second filter capacitor and the circuit disconnecting unit between the high-potential side bus and the low-potential side bus.

15. The filter device according to claim 14, wherein
the first filter reactor and the first filter capacitor constitute a first-stage filter circuit that decreases a noise current generated by the inverter;
the second filter reactor and the second filter capacitor constitute a second-stage filter circuit that decreases a noise current generated by the inverter.

16. The filter device according to claim 14 that is connected to a circuit breaker provided between the overhead line and the second filter reactor, wherein
the rated current of the circuit disconnecting unit is smaller than a rated current of the circuit breaker that is provided between the overhead line and the second filter reactor.

17. The filter device according to claim 14, wherein the circuit disconnecting unit is provided on a high-potential side of the second filter capacitor.

18. The filter device according to claim 14, wherein an inductance value of the first filter reactor is substantially equal to an inductance value of the second filter reactor.

19. The filter device according to claim 14,
wherein an inductance of the coupling compensation inductance element is substantially equal to a mutual inductance between the first filter reactor and the second filter reactor.

20. The filter device according to claim 14, wherein the rated current of the circuit disconnecting unit is equal to or larger than $1/20$ of a maximum current flowing in the circuit breaker and equal to or less than $1/10$ of the maximum current.

* * * * *